United States Patent
Campbell et al.

(10) Patent No.: US 9,101,078 B2
(45) Date of Patent: *Aug. 4, 2015

(54) DATA CENTER COOLING WITH AN AIR-SIDE ECONOMIZER AND LIQUID-COOLED ELECTRONICS RACK(S)

(71) Applicant: INTERNATIONAL BUSINESS MACHINES CORPORATION, Armonk, NY (US)

(72) Inventors: Levi A. Campbell, Poughkeepsie, NY (US); Richard C. Chu, Hopewell Junction, NY (US); Milnes P. David, Fishkill, NY (US); Michael J. Ellsworth, Jr., Lagrangeville, NY (US); Madhusudan K. Iyengar, Foster City, CA (US); Roger R. Schmidt, Poughkeepsie, NY (US); Robert E. Simons, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 134 days.

This patent is subject to a terminal disclaimer.

(21) Appl. No.: 13/676,212

(22) Filed: Nov. 14, 2012

(65) Prior Publication Data
US 2013/0068441 A1 Mar. 21, 2013

Related U.S. Application Data

(63) Continuation of application No. 13/187,563, filed on Jul. 21, 2011.

(51) Int. Cl.
*F28D 15/00* (2006.01)
*H02B 1/00* (2006.01)
(Continued)

(52) U.S. Cl.
CPC .......... *H05K 7/20145* (2013.01); *F28D 1/0477* (2013.01); *H05K 7/203* (2013.01);
(Continued)

(58) Field of Classification Search
CPC ........... F24F 7/00; F24F 1/00; F24F 2012/00; F28B 1/06; F25B 2700/2106; F25B 2700/01; F25B 2313/0293; F25B 2313/0294

USPC ......... 62/259.2, 434, 435, 259.4; 165/104.33; 361/678, 679.47, 679.49, 679.52
See application file for complete search history.

(56) References Cited

U.S. PATENT DOCUMENTS 4,567,733 A 2/1986 Mecozzi
5,832,988 A 11/1998 Mistry et al.
(Continued)

FOREIGN PATENT DOCUMENTS

JP 2010206055 A 9/2010

OTHER PUBLICATIONS

Campbell et al., Office Action for U.S. Appl. No. 13/187,561, filed Jul. 21, 2011 (U.S. Patent Publication No. 2013/0019614 A1), dated Sep. 6, 2013 (28 pages).
(Continued)

*Primary Examiner* — Frantz Jules
*Assistant Examiner* — Erik Mendoza-Wilkenfel
(74) *Attorney, Agent, or Firm* — Steven Chiu, Esq.; Kevin P. Radigan, Esq.; Heslin Rothenberg Farley & Mesiti P.C.

(57) ABSTRACT

A cooling apparatus and method are provided for cooling an electronics rack. The cooling apparatus includes an air-cooled cooling station, which has a liquid-to-air heat exchanger and ducting for directing a cooling airflow across the heat exchanger. A cooling subsystem is associated with the electronics rack, and includes a liquid-cooled condenser facilitating immersion-cooling of electronic components of the electronics rack, a liquid-cooled structure providing conductive cooling to electronic components of the electronics rack, or an air-to-liquid heat exchanger associated with the rack and cooling airflow passing through the electronics rack. A coolant loop couples the cooling subsystem to the liquid-to-air heat exchanger. In operation, heat is transferred via circulating coolant from the electronics rack, and rejected in the liquid-to-air heat exchanger of the cooling station to the cooling airflow passing across the liquid-to-air heat exchanger. In one embodiment, the cooling airflow is outdoor air.

6 Claims, 11 Drawing Sheets

(51) Int. Cl.
    *H05K 7/00* (2006.01)
    *F24F 7/00* (2006.01)
    *H05K 7/20* (2006.01)
    *F28D 1/047* (2006.01)

(52) U.S. Cl.
    CPC ......... *H05K 7/2079* (2013.01); *H05K 7/20318* (2013.01); *H05K 7/20772* (2013.01); *H05K 7/20781* (2013.01); *H05K 7/20827* (2013.01); *H05K 7/20836* (2013.01)

(56) References Cited

U.S. PATENT DOCUMENTS

| | | | |
|---|---|---|---|
| 6,164,369 | A | 12/2000 | Stoller |
| 6,672,955 | B2 | 1/2004 | Charron |
| 7,007,501 | B2 | 3/2006 | Hu |
| 7,173,820 | B2 | 2/2007 | Fink et al. |
| 7,365,973 | B2 | 4/2008 | Rasmussen et al. |
| 7,477,514 | B2 | 1/2009 | Campbell et al. |
| 7,486,511 | B1 | 2/2009 | Griffel et al. |
| 7,492,593 | B2 | 2/2009 | Campbell et al. |
| 7,724,524 | B1 | 5/2010 | Campbell et al. |
| 7,753,766 | B2 | 7/2010 | Master et al. |
| 7,885,070 | B2 | 2/2011 | Campbell et al. |
| 7,903,404 | B2 | 3/2011 | Tozer et al. |
| 7,903,407 | B2* | 3/2011 | Matsushima et al. ......... 361/695 |
| 7,916,483 | B2 | 3/2011 | Campbell et al. |
| 8,141,374 | B2* | 3/2012 | Hay ................................ 62/175 |
| 8,179,677 | B2 | 5/2012 | Campbell et al. |
| 8,184,436 | B2 | 5/2012 | Campbell et al. |
| 2003/0235036 | A1 | 12/2003 | Ostby |
| 2004/0144118 | A1 | 7/2004 | Herbert |
| 2006/0002080 | A1 | 1/2006 | Leija et al. |
| 2009/0086428 | A1 | 4/2009 | Campbell et al. |
| 2009/0086432 | A1 | 4/2009 | Campbell et al. |
| 2009/0126909 | A1* | 5/2009 | Ellsworth et al. ........ 165/104.33 |
| 2009/0268404 | A1* | 10/2009 | Chu et al. ...................... 361/696 |
| 2010/0101759 | A1 | 4/2010 | Campbell et al. |
| 2010/0101765 | A1* | 4/2010 | Campbell et al. ........ 165/104.33 |
| 2010/0103618 | A1 | 4/2010 | Campbell et al. |
| 2010/0130117 | A1 | 5/2010 | Larsen |
| 2010/0136895 | A1 | 6/2010 | Sgro |
| 2010/0170275 | A1 | 7/2010 | Konrad et al. |
| 2010/0188810 | A1 | 7/2010 | Andersen et al. |
| 2010/0236772 | A1 | 9/2010 | Novotny et al. |
| 2010/0275618 | A1* | 11/2010 | Beitelmal et al. .................. 62/56 |
| 2011/0026225 | A1 | 2/2011 | Ostwald et al. |
| 2011/0075353 | A1 | 3/2011 | Attlesey et al. |
| 2011/0103019 | A1 | 5/2011 | Campbell et al. |
| 2011/0134604 | A1 | 6/2011 | Attlesey |
| 2011/0154842 | A1* | 6/2011 | Heydari et al. ............... 62/259.2 |
| 2011/0168793 | A1* | 7/2011 | Kreft et al. ................... 236/44 C |
| 2011/0203785 | A1 | 8/2011 | Federspiel et al. |
| 2011/0315343 | A1 | 12/2011 | Campbell et al. |
| 2011/0315344 | A1 | 12/2011 | Campbell et al. |
| 2011/0315353 | A1 | 12/2011 | Campbell et al. |
| 2012/0006038 | A1* | 1/2012 | Sharma et al. ..................... 62/97 |
| 2013/0019614 | A1 | 1/2013 | Campbell et al. |
| 2013/0021746 | A1 | 1/2013 | Campbell et al. |
| 2013/0068423 | A1 | 3/2013 | Campbell et al. |
| 2013/0070420 | A1 | 3/2013 | Campbell et al. |

OTHER PUBLICATIONS

Campbell et al., Office Action for U.S. Appl. No. 13/676,198, filed Nov. 14, 2012 (U.S. Patent Publication No. 2013/0068423 A1), dated Sep. 6, 2013 (22 pages).

Campbell et al., Notice of Allowance for U.S. Appl. No. 13/187,561, filed Jul. 21, 2011 (U.S. Patent Publication No. 2013/0019614 A1), dated Feb. 19, 2014 (13 pages).

Campbell et al., Notice of Allowance for U.S. Appl. No. 13/676,198, filed Nov. 14, 2012 (U.S. Patent Publication No. 2013/0068423 A1), dated Apr. 10, 2014 (15 pages).

Campbell et al. "Data Center Cooling with an Air-Side Economizer and Liquid-Cooled Electronics Rack(s)". U.S. Appl. No. 13/187,563, filed Jul. 21, 2011.

Campbell et al. "Air-Side Economizer Facilitating Liquid-Based Cooling of an Electronics Rack". U.S. Appl. No. 13/187,561, filed Jul. 21, 2011.

Campbell et al., Office Action for U.S. Appl. No. 13/187,563, filed Jul. 21, 2011 (U.S. Patent Publication No. 2013/0021746 A1), dated May 22, 2014 (30 pages).

* cited by examiner $T_{spec3}$ IS ACCEPTABLY WARM AIR TEMPERATURE TO THE LIQUID-TO-AIR HEAT EXCHANGERS

DATA CENTER COOLING WITH AN AIR-SIDE ECONOMIZER AND LIQUID-COOLED ELECTRONICS RACK(S)

CROSS-REFERENCE TO RELATED APPLICATION

This application is a continuation of U.S. Ser. No. 13/187,563, entitled "Data Center Cooling With An Air-Side Economizer And Liquid-Cooled Electronics Rack(s)," filed Jul. 21, 2011, and which is hereby incorporated herein by reference in its entirety.

BACKGROUND

The power dissipation of integrated circuit chips, and the modules containing the chips, continues to increase in order to achieve increases in processor performance. This trend poses a cooling challenge at both the module and system level. Increased airflow rates are needed to effectively cool high power modules and to limit the temperature of the air that is exhausted into the computer center.

In many large server applications, processors along with their associated electronics (e.g., memory, disk drives, power supplies, etc.) are packaged in removable node configurations stacked within an electronics (or IT) rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single node by providing greater airflow, through the use of a more powerful air moving device or by increasing the rotational speed (i.e., RPMs) of an existing air moving device. However, this approach is becoming problematic at the rack level in the context of a computer installation (i.e., data center).

The sensible heat load carried by the air exiting the rack is stressing the ability of the room air-conditioning to effectively handle the load. This is especially true for large installations with "server farms" or large banks of computer racks close together. In such installations, liquid cooling (e.g., water cooling) is an attractive technology to manage the higher heat fluxes. The liquid absorbs the heat dissipated by the components/modules in an efficient manner. Typically, the heat is ultimately transferred from the liquid to an outside environment, whether air or other liquid coolant.

BRIEF SUMMARY

In one aspect, a method of heat extraction from an electronics rack is provided. The method includes: obtaining a cooling apparatus comprising at least one air-cooled cooling station including a liquid-to-air heat exchanger, and ducting for directing cooling airflow across the liquid-to-air heat exchanger; and at least one cooling subsystem for association with the at least one electronics rack, one cooling subsystem of the at least one cooling subsystem comprising at least one of a liquid-cooled condenser facilitating immersion-cooling of one or more electronic components of the at least one electronics rack, a liquid-cooled structure providing conductive cooling of one or more electronic components of the at least one electronics rack, or an air-to-liquid heat exchanger associated with the at least one electronics rack and cooling airflow passing through the at least one electronics rack; coupling, via at least one coolant loop, the at least one cooling subsystem in fluid communication with the liquid-to-air heat exchanger of the at least one air-cooled cooling station; and establishing cooling airflow through the ducting and across the liquid-to-air heat exchanger, and circulation of coolant through the liquid-to-air heat exchanger, the at least one coolant loop and the one cooling subsystem, wherein heat is transferred via the circulating coolant from the at least one electronics rack and rejected in the liquid-to-air heat exchanger of the at least one air-cooled cooling station to the cooling airflow passing across the liquid-to-air heat exchanger.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
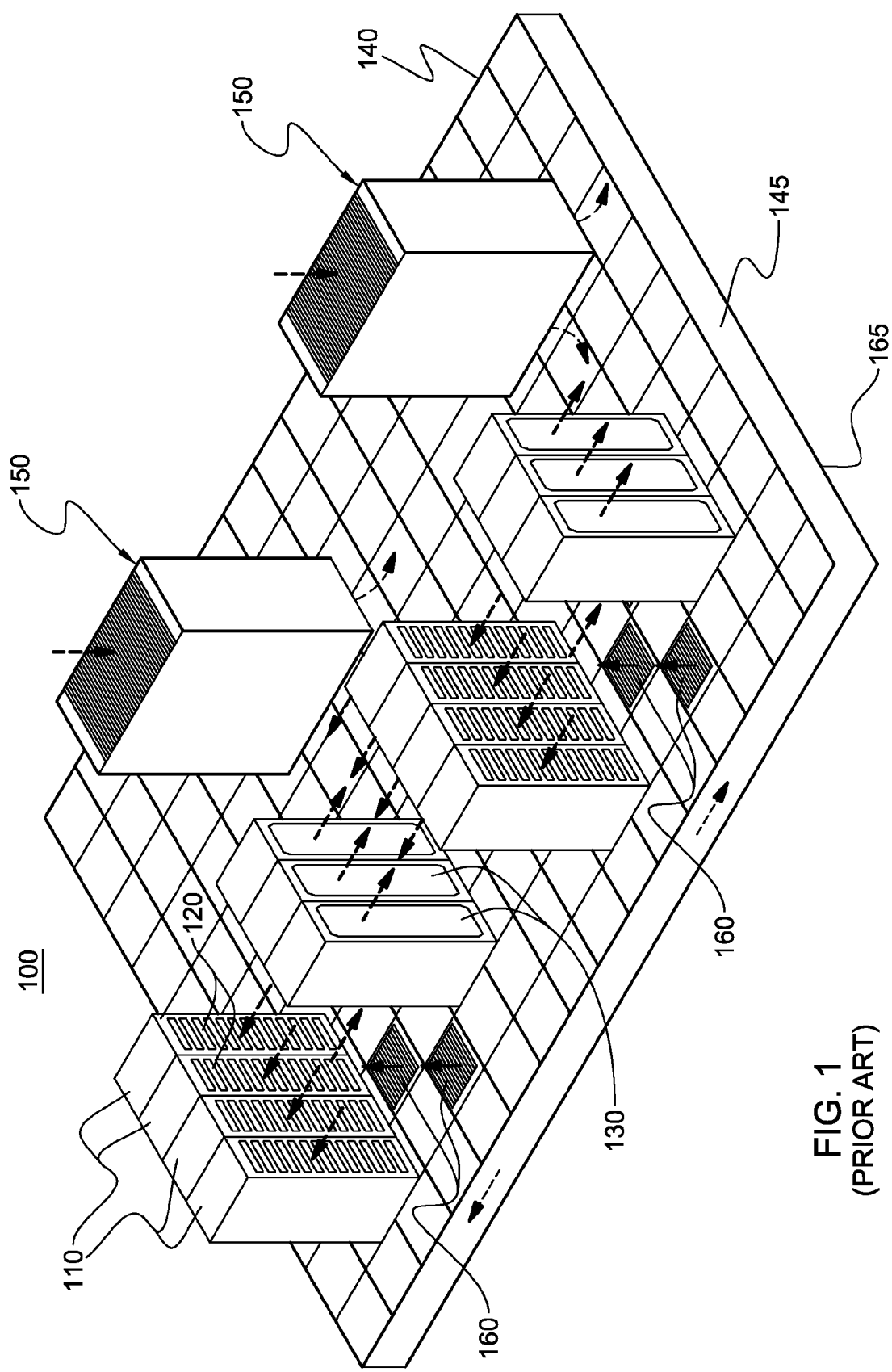
FIG. 1. depicts one embodiment of a conventional raised floor layout of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronic system, and may be, for example, a stand-alone computer processor having high, mid or low end processing capability. In one embodiment, an electronics rack may comprise a portion of an electronic system, a single electronic system, or multiple electronic systems, for example, in one or more sub-housings, blades, books, drawers, nodes, compartments, etc., having one or more heat-generating electronic components disposed therein. An electronic system(s) within an electronics rack may be movable or fixed relative to the electronics rack, with the rack-mounted electronic drawers of a multi-drawer rack unit and blades of a blade center system being two examples of systems (or subsystems) of an electronics rack to be cooled.

"Electronic component" refers to any heat generating electronic component of, for example, a computer system or other electronic system requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier.

Unless otherwise specified herein, the terms "liquid-cooled structure" and "liquid-cooled cold plate" refer to thermally conductive structures having one or more channels (or passageways) or chambers formed therein or passing therethrough, which facilitate flow of coolant therethrough. In one example, tubing may be provided extending into or through the liquid-cooled structure (or liquid-cooled cold plate).

As used herein, "air-to-liquid heat exchanger" and "liquid-to-air heat exchanger" mean any heat exchange mechanism characterized as described herein through which liquid coolant can circulate; and includes one or more discrete heat exchangers coupled either in series or in parallel. A liquid-to-air or air-to-liquid heat exchanger may comprise, for example, one or more coolant flow paths, formed of thermally conductive tubings (such as copper or other tubing) in thermal or mechanical contact with a plurality of air-cooled or air-cooling fins. Size, configuration and construction of the heat exchanger can vary without departing from the scope of the invention disclosed herein. As used herein, in operation, an air-to-liquid heat exchanger refers to a heat exchanger wherein heat is transferred from the air passing across the heat exchanger to the liquid passing through the heat exchanger, and a liquid-to-air heat exchanger refers to a heat exchanger wherein heat is transferred from the liquid passing through the heat exchanger to the air passing across the heat exchanger. Further, as used herein "data center" refers to a computer installation containing, for example, one or more electronics racks to be cooled. As a specific example, a data center may include one or more electronic racks, such as server racks.

One example of the coolant employed herein is liquid water. However, the concepts disclosed herein are readily adapted to use with other types of coolant. For example, one or more of the coolants may comprise a brine, a dielectric liquid, a fluorocarbon liquid, a liquid metal, or other similar coolant, or refrigerant, while still maintaining the advantages and unique features of the present invention.

Reference is made below to the drawings, which are not drawn to scale to facilitate understanding thereof, wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic devices within the subsystem(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more computer room air-conditioning (CRAC) units 150, also disposed within the data center 100. Room air is taken into each air conditioning unit 150 near an upper portion thereof. This room air may comprise in part exhausted air from the "hot" aisles of the computer installation defined, for example, by opposing air outlet sides 130 of the electronics racks 110.

Due to the ever-increasing airflow requirements through electronics racks, and the limits of air distribution within the typical data center installation, novel cooling apparatuses and methods are needed. Disclosed herein, therefore, are cooling apparatuses and methods combining a liquid-based cooling approach with, for example, an air-side economizer, for extracting heat from the liquid coolant. FIGS. 2-11 illustrate various embodiments of data centers implementing such cooling apparatuses and methods for cooling electronic subsystems of multiple electronics racks, in accordance with one or more aspects of the present invention.

As noted initially, data center equipment may house several hundred, or even several thousand heat-generating electronic components, such as microprocessors. Cooling computer and telecommunications equipment rooms can be a major challenge. In fact, cooling has been found to contribute about one-third of the energy use of a typical IT data center.

In a conventional data center, sub-ambient temperature, refrigerated water leaves a chiller plant evaporator, and is circulated through one or more CRAC units (see FIG. 1) using building chilled water pumps. This water carries heat away from the air-conditioned, raised floor room that houses the IT equipment, and rejects the heat into the refrigeration chiller evaporator via a heat exchanger. The refrigeration chiller operates on a vapor-compression cycle that consumes compression work (compressor). The refrigerant loop rejects the heat into a condenser water loop using another chiller heat exchanger (chiller). A condenser pump circulates water between the chiller condenser and the air-cooled, evaporative cooling tower. The air-cooled cooling tower uses forced air movement and water evaporation to extract heat from the condenser water loop, and transfer it into the ambient environment. Thus, in such a "standard" facility cooling design, the primary cooling energy consumption components are: the server fans; the computer room air-conditioning (CRAC) unit blowers; the building chilled water (BCW) pumps; the refrigeration chiller compressors; the condenser water pumps; and the cooling tower fans.

As a departure from this typical cooling approach, cooling apparatuses and methods are disclosed herein which provide energy efficient cooling of electronic subsystems, such as servers, and other information technology equipment, of a data center. As described below, in one embodiment, outdoor air is drawn in and conditioned as a cooling airflow to which heat is rejected from one or more liquid-cooled electronic subsystems of one or more electronics racks within the data center. The outdoor air may be used "as is", or may be conditioned using, for example, a filter and an evaporative cooling system in which water is sprayed onto a porous media, while the outdoor air is forced through the media, thus evaporating the water resident on the surfaces of the porous media directly into the air. Such an evaporative cooling system, which reduces the dry bulb temperature of the air, may comprise a commercially available evaporative media and/or system, such as the evaporative cooling media and/or systems available from Munters Corporation, of Amesbury, Mass., U.S.A. Using such an evaporative cooling system can reduce the temperature of the outdoor air drawn into the cooling apparatus to be close to the air's wet bulb temperature. Thus, in hot summer months, the use of evaporative cooling (for example, at the inlet of a cooling airflow supply plenum of the cooling apparatus) can provide significant reduction in the intake air temperature; that is, provide a significant reduction of the temperature of the outdoor air used for indoor cooling, as described hereinbelow.

Unfortunately, it can be problematic to use outdoor air directly inside a data center room, even with further cooling using evaporative methods. Outdoor air can often possess several undesirable attributes, such as containing particulate pollution or chemical or gaseous pollution, which both can be extremely harmful to electronic hardware. Thus, disclosed herein is a data center cooling system that possess the beneficial energy-saving attributes of an air-side, economizer-based cooling approach, but which also provides protection from the harmful properties of the outdoor air.

Figure 2:
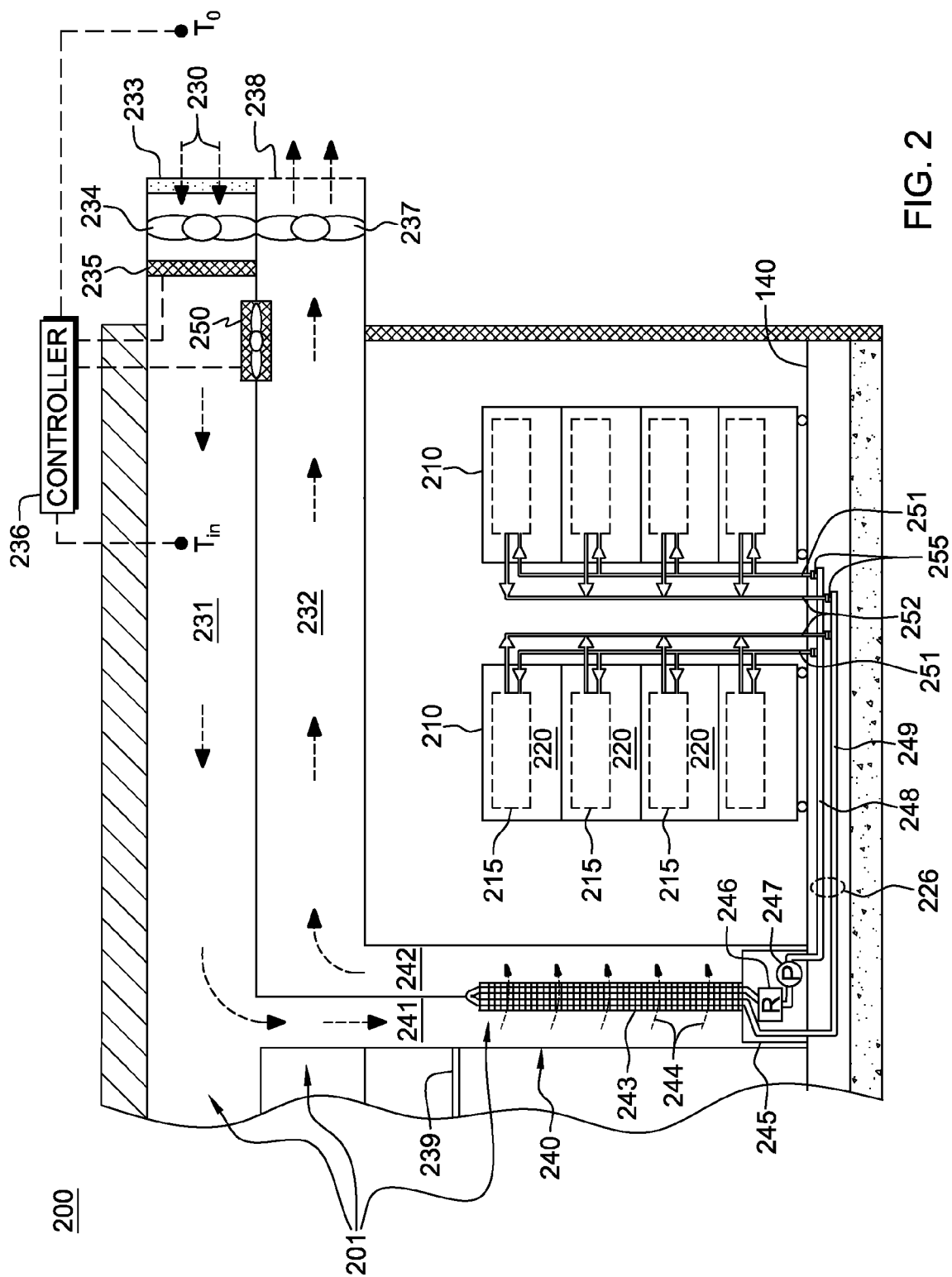
FIG. 2 is a schematic of one embodiment of a data center comprising one or more electronics racks and a cooling apparatus, in accordance with one or more aspects of the present invention.

FIG. 2 depicts a data center, generally denoted 200, comprising one embodiment of such a cooling apparatus. As shown, the cooling apparatus comprises an air-side economizer 201 and liquid-based cooling of one or more electronic subsystems 220 of one or more electronics racks 210. Specifically, in the depicted embodiment, data center 200 includes one or more air-cooled cooling stations 240, each of which is (in one embodiment) a shared, central cooling station providing cooling to multiple electronics racks. Additionally, the air-cooled cooling station(s) is separate and free-standing from the electronics racks 210. Air-cooled cooling station 240 includes (in one embodiment) a vertically-extending, liquid-to-air heat exchanger 243 and supply and return ducting 241, 242 for directing a cooling airflow 244 across liquid-to-air heat exchanger 243.

The liquid-based cooling aspect of the cooling apparatus includes, in one embodiment, multiple cooling subsystems comprising one or more of a liquid-cooled condenser for facilitating immersion-cooling of one or more electronic components of an electronics rack of the data center, a liquid-cooled structure providing conductive cooling to one or more electronic components of an electronics rack, or an air-to-liquid heat exchanger associated with an electronics rack and cooling airflow passing through the electronics rack. In the embodiment of FIG. 2, the cooling subsystems 215 disposed within the electronic subsystems 220 of the multiple electronics racks 210 are assumed to comprise one or more of the liquid-cooled condenser for facilitating immersion-cooling of one or more electronic components within the electronic subsystem(s), or the liquid-cooled structure providing conductive cooling to one or more electronic components of the electronic subsystem(s). Note in this regard that the concepts described herein may be implemented either homogeneously or heterogeneously within the data center. Thus, between electronics racks, different types of cooling subsystems (such as described herein) may be employed, or even within a given electronics racks different types of cooling subsystems may be employed or combined, as described further below. As a further variation, if the coolant being pumped to the electronics racks is a dielectric coolant, then direct immersion-cooling of one or more electronic components of an electronic subsystem of the electronics rack may be employed using the dielectric coolant.

In the embodiment depicted in FIG. 2, the cooling apparatus further includes a coolant loop 226 coupling in fluid communication the liquid-cooled electronic subsystems and the shared, central liquid-to-air heat exchanger 243. In one embodiment, each shared, central liquid-to-air heat exchanger provides cooling for multiple electronics (or IT) racks within the data center. For example, a centralized, air-cooled cooling station comprising liquid-to-air heat exchanger 243 could service a large portion of a data center, or even the full data center, in the case of a small to medium facility. Advantageously, the use of one or more centralized cooling stations allows for the use of larger radiator coils and larger ducts to transport outdoor cooling airflow to the centralized location(s).

As illustrated in the embodiment of FIG. 2, liquid-to-air heat exchanger 243 of the central, air-cooled cooling station includes one or more coolant flow tubes through which the heated coolant circulates for dissipation of heat to the cooling airflow passing across the liquid-to-air heat exchanger. Liquid-to-air heat exchanger 243 further includes, in this example, a plurality of air-cooling fins which may be, in one example, oriented horizontally within the liquid-to-air heat exchanger 243. As illustrated, the air-cooled cooling station further includes a central coolant distribution unit 245 comprising a coolant reservoir 246 and one or more coolant pumps 247 for pumping cooled coolant via a coolant supply manifold 248 to the cooling subsystems of the electronics racks within the data center. Heated coolant is exhausted via a common coolant return manifold 249 for return to the liquid-to-air heat exchanger 243.

In the example of FIG. 2, multiple quick connect couplings 255 are provided in association with the coolant loops(s) 226 to facilitate connection or disconnection of the respective liquid-cooled electronic subsystem(s) to the central, air-cooled cooling station 240. The quick connect couplings 255 may be any one of various types of commercially available couplings, such as those available from Colder Products Co., of St. Paul, Minn., USA, or Parker Hannifin, of Cleveland, Ohio, USA.

As illustrated in FIG. 2, an airflow damper 239 may be provided to control the amount of cooling airflow 244 flowing through supply ducting 241 to liquid-to-air heat exchanger 243. In the embodiment of FIG. 2, air-side economizer 201 further includes a cooling airflow supply plenum 231 and an airflow exhaust plenum 232. Cooling airflow supply plenum 231 receives outdoor air 230 after being drawn across a filter 233 via an outdoor air intake fan 234. In the embodiment depicted, an evaporative cooling system 235 and a controller 236 are provided to selectively cool the outdoor air, depending upon its temperature, as explained further below.

In one embodiment, cooling airflow 244 may be provided in parallel to the supply ducting 241 of multiple shared, central cooling stations 240 of data center 200, and the heated airflow is exhausted via return ducting 242 in parallel from the multiple cooling stations to the airflow exhaust plenum 232. By way of example only, the cooling airflow supply plenum and airflow exhaust plenum may comprise overhead plenums within the data center.

FIG. 2 also illustrates a controllable recirculation fan (and louver system (not shown)) 250, which comprises a fan that is selectively controlled (as explained further below), for example, during winter months, in order to recirculate a portion of the heated airflow exhaust in the airflow exhaust plenum 232 directly into the cooling airflow supply plenum 231 for mixing with the cold outdoor air 230, drawn into the cooling apparatus. In winter operation, the evaporative cooling system 235 would be shut OFF by controller 236.

To summarize, in operation, outdoor air 230 is drawn in through, for example, particulate filter 233, and may be forced through an evaporative cooling system 235, after which it is distributed via the cooling airflow supply plenum 231 to one or more parts of data center 200. The cooling airflow supply plenum 231 feeds one or more vertical supply ducts 241 with cooling airflow 244, and this cooling airflow passes through the respective liquid-to-air heat exchanger(s) 243, and returns via vertical return ducting 242, to airflow exhaust plenum 232, where it is exhausted through an exhaust vent 238 by an exhaust fan 237 to outside the data center. While the intake and exhaust openings to the cooling airflow supply plenum and airflow exhaust plenum, respectively, are shown in FIG. 2 adjacent to each other, in reality, the intake and exhaust openings may be disposed remote from each other. By remotely disposing the intake and exhaust openings, any mixing of the warm exhaust air with the cooler intake air can be avoided. As explained further below, in winter months, when the outdoor air temperature may be quite cold, the outdoor air temperature may be heated by recirculating a portion of the warmer exhaust air (as shown in FIG. 2), wherein the controllable recirculation fan 250 is provided, along with an appropriate opening (or ducting), to facilitate controlled heating of the intake air using the warmer exhaust air stream.

As described above, in the embodiment depicted in FIG. 2, the electronic subsystems (e.g., server nodes) may incorporate various types of cooling subsystems, each of which relies on direct or indirect liquid-based cooling of one or more electronic components of the respective electronic subsystem. For example, one cooling subsystem 215 within a particular electronic subsystem 220 may comprise a liquid-cooled condenser which facilitates immersion-cooling of one or more electronic components of the electronics rack (as explained further below with reference to FIG. 8), or a liquid-cooled structure providing conductive cooling to one or more electronic components of the electronics rack (as explained further below with reference to FIGS. 6-7). In the immersion-cooling example, a dielectric fluid may be sealed within a housing comprising the one or more electronic components, with the liquid-cooled condenser also being disposed within the housing or external to the housing, and with circulating coolant (such as water) passing through the liquid-cooled condenser or liquid-cooled structure.

Coolant is circulated through the cooling subsystems, the coolant loop and the liquid-to-air heat exchanger via the central coolant distribution unit 245, which as noted comprises (in one embodiment) coolant reservoir 246 and one or more coolant pumps 247 for pumping cooled coolant via the coolant supply manifold 248 to the cooling subsystems of the electronics racks within the data center. Heated coolant is exhausted via the common coolant return manifold 249 for passage through the liquid-to-air heat exchanger 243. One or more coolant-carrying channels extend through the liquid-cooled condenser and are in fluid communication with the respective rack-level supply and return manifolds 251, 252. In the embodiment illustrated, the coolant flow tubing within liquid-to-air heat exchanger 243 is oriented vertically within the heat exchanger, and the air-cooled fins are oriented substantially horizontally (by way of example only).

Note in the embodiments described herein, in operation, coolant is circulated between the respective cooling subsystems within the associated electronics racks and the centralized liquid-to-air heat exchanger of the shared, air-cooled cooling station. Heat is transferred via the circulating coolant from one or more heat-generating electronic components within the electronic subsystems, and rejected in the liquid-to-air heat exchanger of the shared cooling station to the cooling airflow passing across the liquid-to-air heat exchanger. The heated airflow is then exhausted via, for example, the common airflow exhaust plenum.

The airflow damper 239 may be placed in open position to allow unimpeded flow of cooling airflow through the vertical supply duct, or may be placed in closed position when, for example, the cooling station is not in use. In the closed position, the vertical supply and return ducts are blocked by the damper, which cuts off any airflow through the unused, air-cooled cooling station, thus preventing waste of any forced airflow within the air-side economizer.

Quick connect couplings provided at (for example) inlet and outlet ports of the coolant supply and return manifolds 248, 249 facilitate connection and disconnection of the liquid-cooled electronic subsystems to the coolant loop 226, and thus to the air-cooled cooling station(s).

Note that advantageously, the only cooling energy consumed in the cooling apparatus of FIG. 2 is at the intake and exhaust fans, the selectively operated recirculation fan, the selectively operated evaporative cooling system (e.g., the water pump for distributing water to the evaporative cooling media of the system), and the pump in the coolant distribution unit.

The liquid-based heat extraction portion of the cooling apparatus depicted in FIG. 2 can be implemented in a variety of ways, and as noted, can be implemented either homogeneously or heterogeneously within the data center. FIGS. 3-8 described below depict various cooling subsystems and cooling subsystem combinations for extracting heat from one or more electronics racks of the data center.

Figure 3:
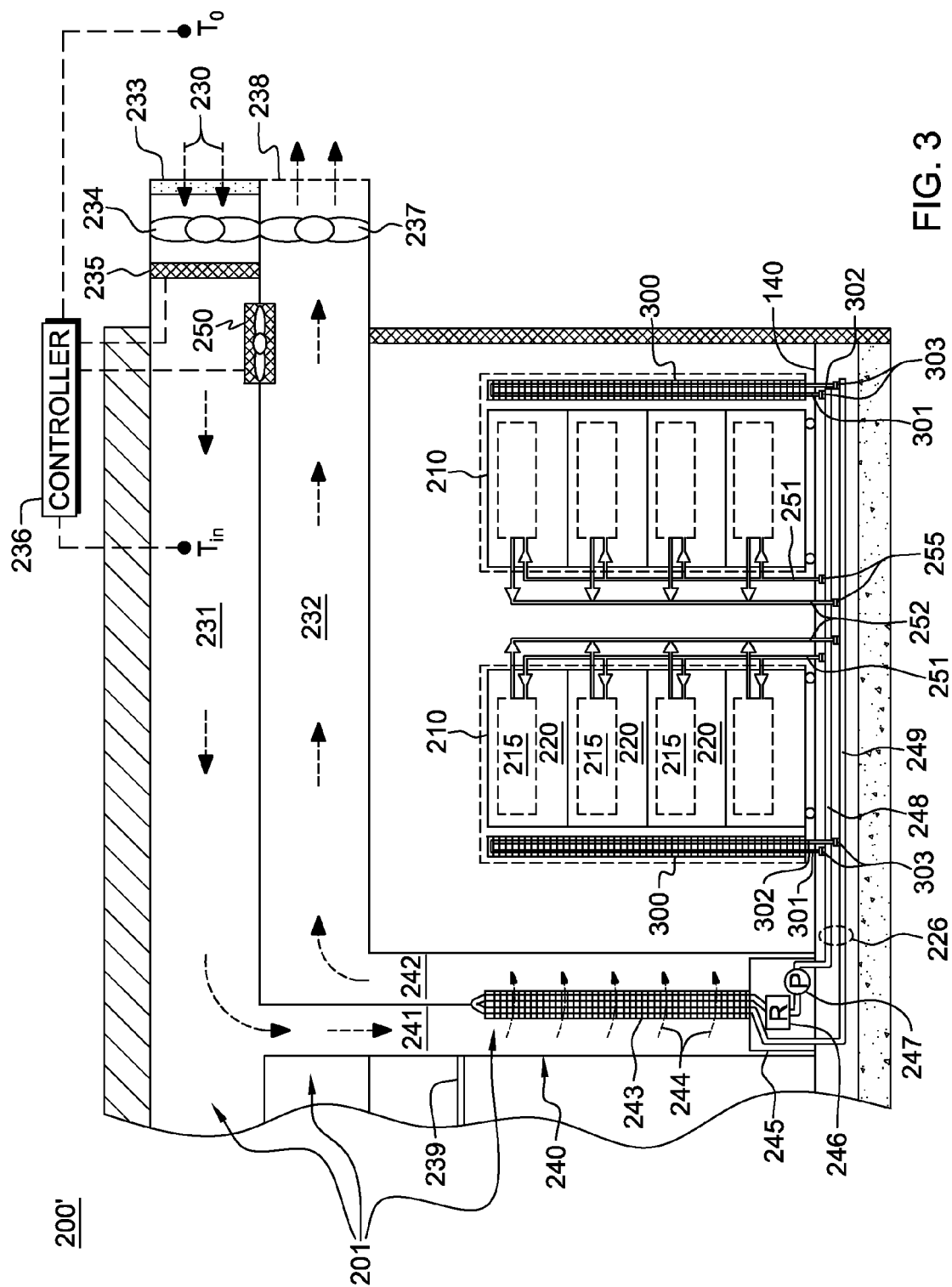
FIG. 3 is a schematic of an alternate embodiment of a data center comprising a cooling apparatus, including an air-side economizer and liquid-based cooling of one or more electronics racks, in accordance with one or more aspects of the present invention.

FIG. 3 depicts an alternate embodiment of a data center 200', in accordance with one or more aspects of the present invention. As illustrated, data center 200' is substantially identical to data center 200 described above in connection with FIG. 2. One difference, however, is the addition of additional cooling subsystems 300 to the electronics racks 210. In this example, the additional cooling subsystems 300 comprise air-to-liquid heat exchangers mounted (for example, within a door) at the air inlet side or air outlet side of the electronics rack. These air-to-liquid heat exchangers are associated with the respective electronics rack and cool airflow passing through the electronics rack. In certain rack configurations, it may be difficult and expensive to cool the full electronics rack heat load using, for example, a liquid-cooled condenser in combination with immersion-cooling of the electronic components of the rack, or one or more liquid-cooled structures to provide conductive cooling of the electronic components of the rack. Thus, in an alternate configuration, an air-to-liquid heat exchanger may be added as one cooling subsystem 300, either alone or in combination with a liquid-cooled condenser or liquid-cooled structure, such as described above. As a further example, an enclosure (not shown) may be provided around the electronics rack and the air-to-liquid heat exchanger, so that a closed-loop air recirculation path is defined within the enclosure, and heat within the enclosure produced by the electronics rack is extracted, at least in part, by the air-to-liquid heat exchanger. Thus, in one embodiment, the liquid coolant cooled by the central, air-cooled cooling station 240 may be used to cool some of the components within an electronics rack using, for example, liquid-cooled conduction structures or liquid-cooled condenser structures (in an immersion-cooled embodiment), and also used to cool air flowing through the electronics rack (for example, within an enclosure enclosing the air-to-liquid heat exchanger and the electronics rack). In this manner, the entire rack heat load may be efficiently removed via the liquid coolant (e.g., cooled water) to the central, air-cooled cooling station.

Figure 4:
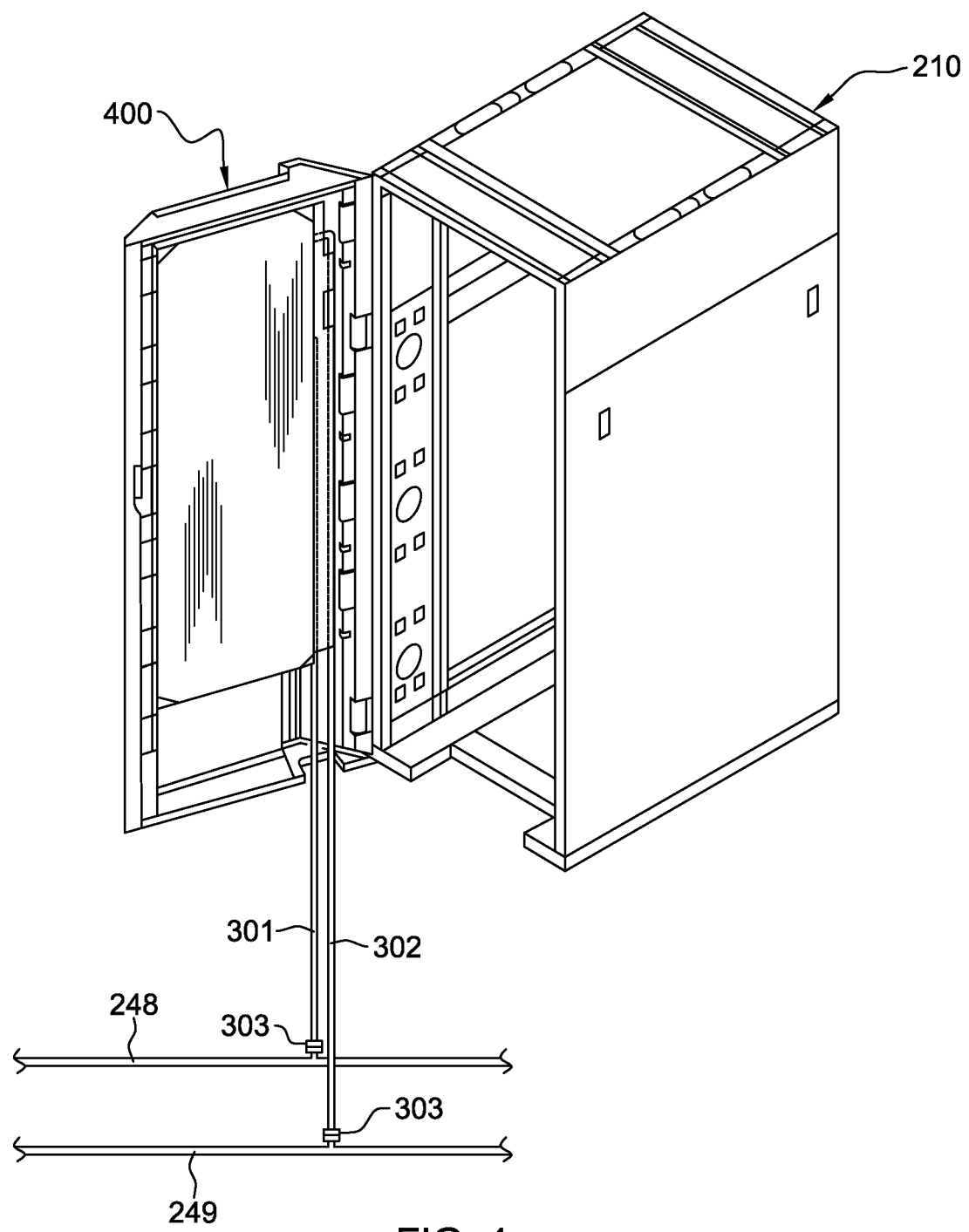
FIG. 4 depicts one embodiment of an electronics rack and an associated cooling subsystem comprising one embodiment of an air-to-liquid heat exchanger, in accordance with one or more aspects of the present invention.

FIGS. 3 & 4 depict one embodiment of cooling subsystem 300 implemented as a door-mounted, air-to-liquid heat exchanger 400. This door-mounted, air-to-liquid heat exchanger includes a rack-level coolant supply plenum 301 and rack-level coolant return plenum 302, which are respectively coupled to the coolant supply manifold 248 and coolant return manifold 249, described above in connection with the data center embodiment of FIG. 2. Quick connect couplings 303 may be provided to facilitate connection of the respective rack-level plenums to the coolant supply and return manifolds 248, 249. As noted, in one embodiment, an air-tight enclosure (not shown) could enclose electronics rack 210 and the air-to-liquid heat exchanger in order to facilitate closed-path circulation of air through the heat exchanger and the electronics rack, thereby providing air-cooling of electronic components within the electronics rack, with heat being rejected to the liquid coolant provided by the coolant supply and return manifolds 248, 249.

In one embodiment, the coolant supply and return manifolds 248, 249 may comprise fixed plumbing pipes, such as, for example, copper tubing disposed, in one example, beneath a raised floor 140 of the data center.

Figure 5:
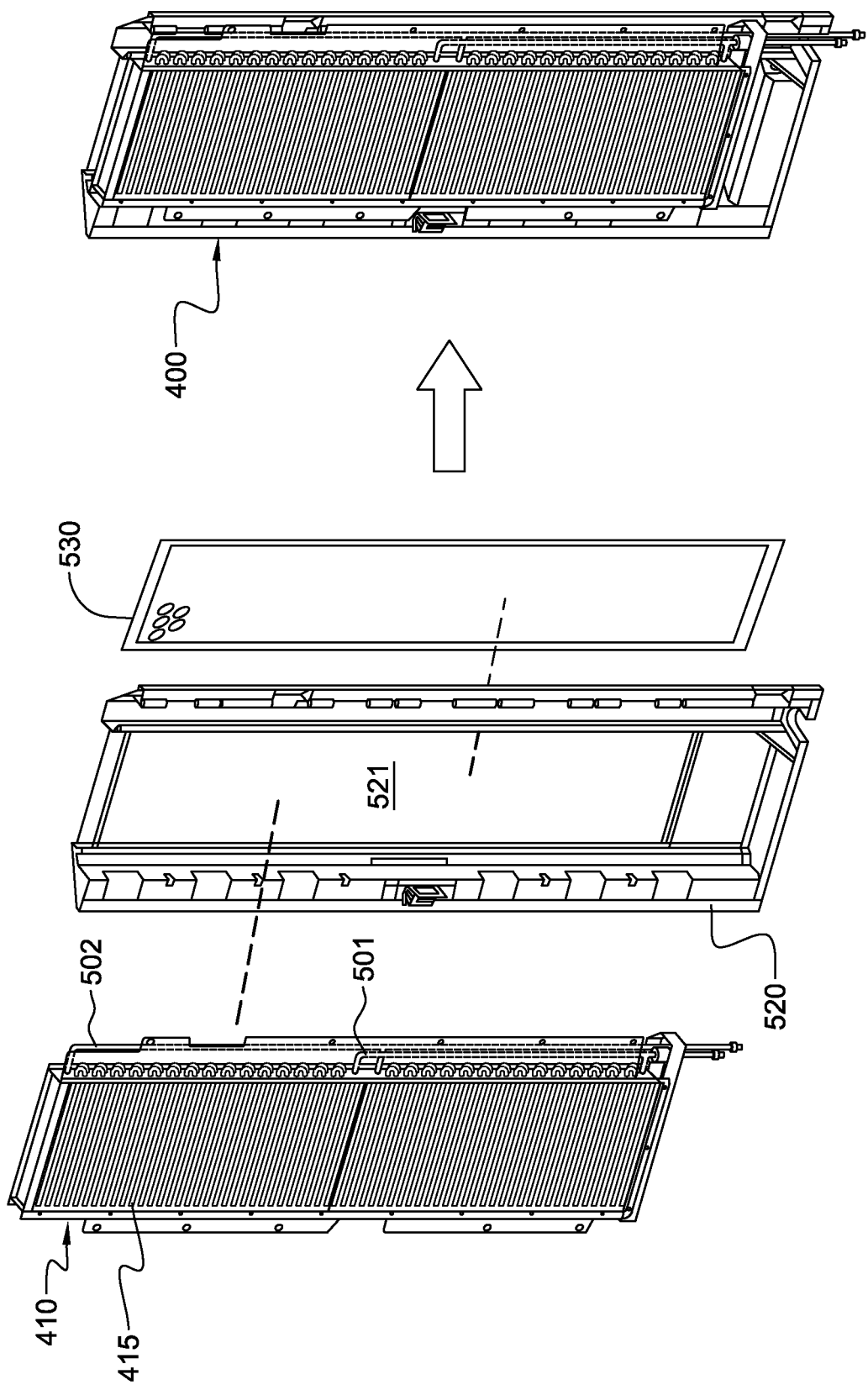
FIG. 5 is a partially exploded, isometric view of one embodiment of a heat exchanger door, including a heat exchange coil and inlet and outlet plenums for the cooling subsystem, in accordance with one or more aspects of the present invention.

FIG. 5 depicts additional details of one embodiment of a heat exchanger door 400, in accordance with one or more aspects of the present invention. As shown at the left portion of the figure, heat exchanger 410 includes one or more tube sections 415, which in one embodiment, may have a plurality of fins projecting therefrom. Depending upon the implementation, tube sections 415 may comprise a single, serpentine channel, or a plurality of discrete heat exchange tube sections coupled together via coolant inlet and outlet plenums 501, 502 disposed at the edge of the heat exchanger door configured to hingedly mount to the electronics rack. In one embodiment, multiple discrete heat exchange tube sections (e.g., an upper tube section and a lower tube section) may be employed as the heat exchanger. As shown, the one or more heat exchange tube sections are sized to substantially cover the entire opening 521 in the frame 520 of the heat exchanger door.

In the depicted embodiment, the heat exchange tube sections are fed coolant by coolant inlet plenum 501 and exhaust coolant via coolant outlet plenum 502. Flexible hoses (not shown) may be employed for connecting to hard plumbing disposed near the electronics rack. These hoses would be brought into heat exchanger door 400 adjacent to the hinge axis of the door.

In the embodiment of FIG. 5, a raised floor embodiment is assumed where hoses are routed through floor tile cut-outs (not shown) into heat exchanger door 400 for connecting to quick connect couplings. In a non-raised floor environment, right angle adapters could be installed at the edge of each hose to allow the coolant to make a sharp turn at the base of the heat exchanger door. The hoses are configured to plug into each manifold via industry standard, hydraulic, quick connect couplings. Once the hoses are plugged into the respective couplings and secured, the hoses (or adapters) rotate around each other as the heat exchanger door 400 is pivoted open and closed, providing a minimum of movement to the hoses.

Continuing with FIG. 5, one embodiment of an optional perforated planar surface 530 is illustrated. First and second such perforated planar surfaces 530 could be provided for covering first and second main sides of the heat exchanger. In one embodiment, the perforated planar surfaces comprise metal plates having appropriate air flow openings to allow inlet-to-outlet airflow through the electronics rack to readily pass through the heat exchanger. One embodiment of airflow openings in the perforated planar surfaces is depicted in FIG. 5. In this embodiment, the perforated planar surface has a plurality of openings disposed throughout the plate. As one example, these openings may comprise hexagon-shaped openings which maximize air flow through the perforated surfaces, while still providing the desired isolation of the heat exchanger.

Each heat exchange tube section illustrated in FIG. 5 may comprise at least one of a continuous tube or multiple tubes connected together to form one continuous serpentine cooling channel. In the embodiment shown, each heat exchange tube section is a continuous tube having a first diameter, and each plenum 501, 502, is a tube having a second diameter, wherein the second diameter is greater than the first diameter. The first and second diameters are chosen to ensure adequate supply of coolant flow through the multiple tube sections. In one embodiment, each heat exchange tube section may align to a respective electronics subsystem of the electronics rack.

Although not shown in FIG. 5, the heat exchange tube sections further include a plurality of fins extending from tube(s) 415 to facilitate heat transfer, for example, from air exhausted out the back of the electronics rack to coolant flowing through the serpentine cooling channels of the individual heat exchange tube sections. In one embodiment, the plurality of fins comprise aluminum fins extending from the individual tubes, which could be constructed of copper tubing. Further, in one implementation, the fins are brazed to the tubing. As explained above, the positioning, density, thickness and depth of the fins are selected to control airflow impedance through the resultant heat exchanger. Additionally, the number and diameter of tubes of the individual heat exchange tube sections, as well as the size, configuration and placement of the air flow openings in the first and second perforated planar surfaces are selected to control the overall air flow impedance through the heat exchanger.

Figure 6:
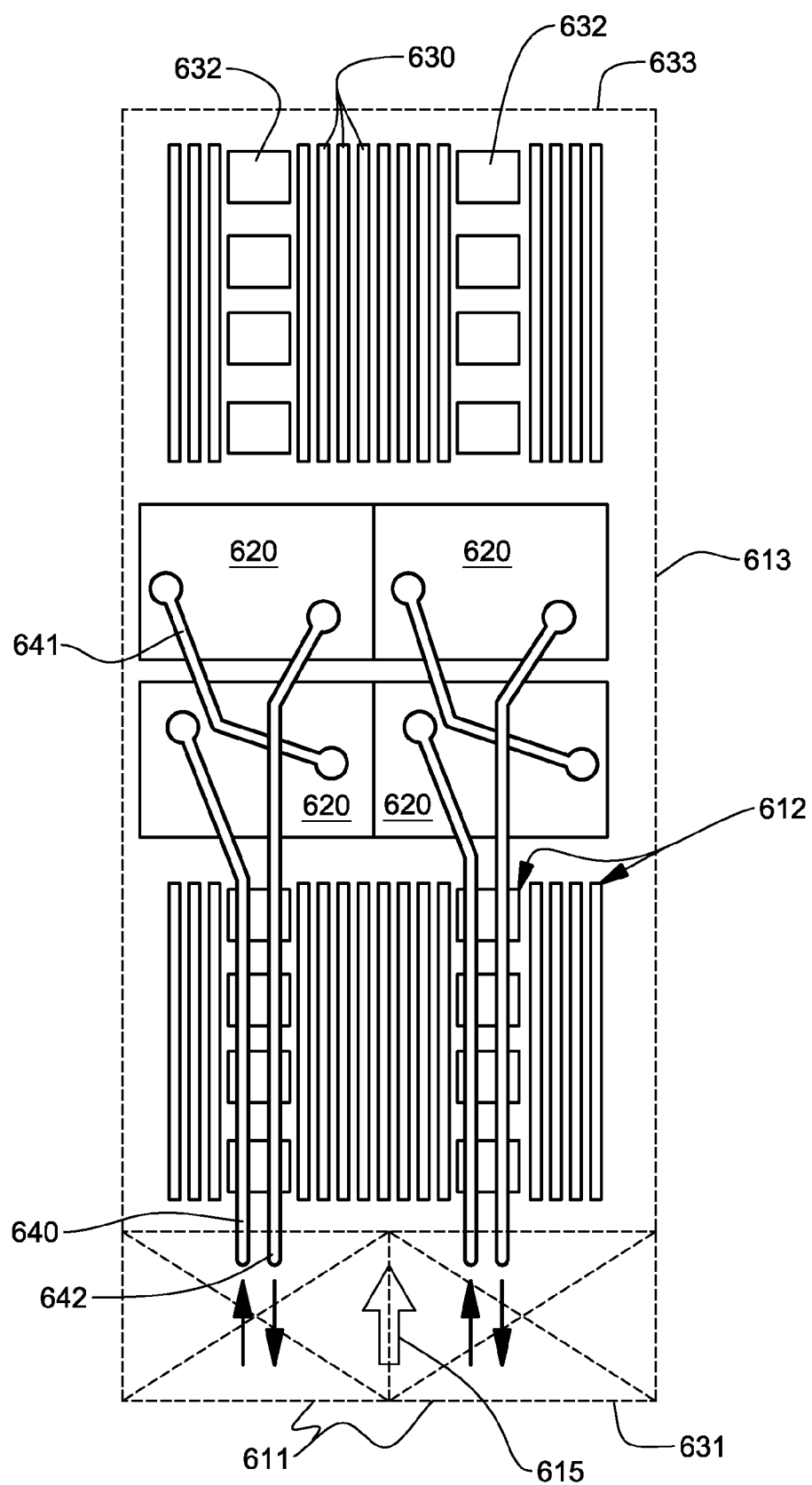
FIG. 6 is a plan view of one embodiment of an electronic subsystem layout for an electronics rack, and illustrating air-cooling in combination with multiple cooling subsystems comprising multiple liquid-cooled structures providing conductive cooling to multiple electronic components of the electronic subsystem, in accordance with one or more aspects of the present invention.

FIG. 6 depicts one embodiment of a liquid-cooled electronic subsystem 613 component layout wherein one or more air moving devices 611 provide forced air flow 615 to cool multiple components 612 within electronics subsystem 613. Cool air is taken in through a front 631 and exhausted out a back 633 of the subsystem. The electronic components to be cooled include multiple processor modules to which liquid-cooled cold plates 620 (of a liquid-based cooling system) are coupled, as well as multiple arrays of memory modules 630 (e.g., dual in-line memory modules (DIMMs)) and multiple rows of memory support modules 632 (e.g., DIMM control modules) to which air-cooled heat sinks are coupled (in one embodiment). In the embodiment illustrated, memory modules 630 and the memory support modules 632 are partially arrayed near front 631 of electronics subsystem 613, and partially arrayed near back 633 of electronic subsystem 613. Also, in the embodiment of FIG. 6, memory modules 630 and the memory support modules 632 are cooled by air flow 615 across the electronic subsystem.

The illustrated liquid-based cooling system further includes multiple coolant-carrying tubes connected to and in fluid communication with liquid-cooled cold plates 620. The coolant-carrying tubes comprise sets of coolant-carrying tubes, with each set including (for example) a coolant supply tube 640, a bridge tube 641 and a coolant return tube 642. In this example, provided by way of example only, each set of tubes provides liquid coolant to a series-connected pair of cold plates 620 (coupled to a pair of processor modules). Coolant flows into a first cold plate of each pair via the coolant supply tube 640 and from the first cold plate to a second cold plate of the pair via bridge tube or line 641, which may or may not be thermally conductive. From the second cold plate of the pair, coolant is returned through the respective coolant return tube 642.

Figure 7:
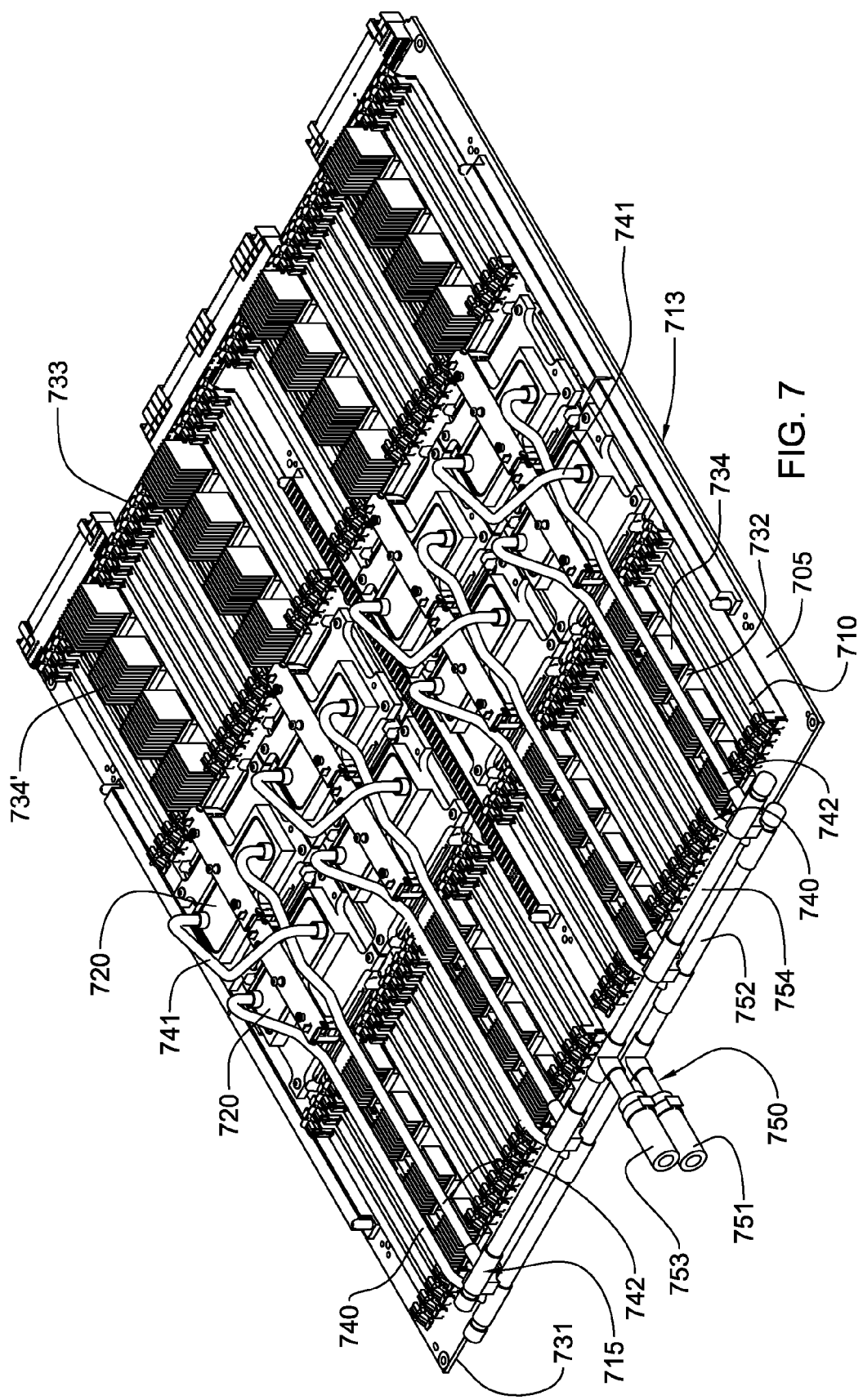
FIG. 7 depicts one detailed embodiment of a partially assembled electronic subsystem layout, wherein the electronic subsystem includes eight high-heat-generating electronic components to be cooled, each having a respective liquid-cooled structure associated therewith, in accordance with one or more aspects of the present invention.

FIG. 7 depicts in greater detail an alternate electronics subsystem layout comprising eight processor modules, each having a respective liquid-cooled cold plate of a liquid-based cooling system coupled thereto. The liquid-based cooling system is shown to further include associated coolant-carrying tubes for facilitating passage of liquid coolant through the liquid-cooled cold plates and a header subassembly to facilitate distribution of liquid coolant to and return of liquid coolant from the liquid-cooled cold plates. By way of specific example, the liquid coolant passing through the liquid-based cooling subsystem is cooled water.

FIG. 7 is an isometric view of one embodiment of an electronic subsystem or drawer, and monolithic cooling system. The depicted planar server assembly includes a multi-layer printed circuit board to which memory DIMM sockets and various electronic devices to be cooled are attached both physically and electrically. In the cooling system depicted, a supply header is provided to distribute liquid coolant from a single inlet to multiple parallel coolant flow paths and a return header collects exhausted coolant from the multiple parallel coolant flow paths into a single outlet. Each parallel coolant flow path includes one or more cold plates in series flow arrangement to facilitate cooling one or more electronic devices to which the cold plates are mechanically and thermally coupled. The number of parallel paths and the number of series-connected liquid-cooled cold plates depends, for example, on the desired device temperature, available coolant temperature and coolant flow rate, and the total heat load being dissipated from each electronic device.

More particularly, FIG. 7 depicts a partially assembled electronic subsystem 713 and an assembled liquid-based cooling system 715 coupled to primary heat-generating components (e.g., including processor dies) to be cooled. In this embodiment, the electronic system is configured for (or as) an electronics drawer of an electronics rack, and includes, by way of example, a support substrate or planar board 705, a plurality of memory module sockets 710 (with the memory modules (e.g., dual in-line memory modules) not shown), multiple rows of memory support modules 732 (each having coupled thereto an air-cooled heat sink 734), and multiple processor modules (not shown) disposed below the liquid-cooled cold plates 720 of the liquid-based cooling system 715.

In addition to liquid-cooled cold plates 720, liquid-based cooling system 715 includes multiple coolant-carrying tubes, including coolant supply tubes 740 and coolant return tubes 742 in fluid communication with respective liquid-cooled cold plates 720. The coolant-carrying tubes 740, 742 are also connected to a header (or manifold) subassembly 750 which facilitates distribution of liquid coolant to the coolant supply tubes and return of liquid coolant from the coolant return tubes 742. In this embodiment, the air-cooled heat sinks 734 coupled to memory support modules 732 closer to front 731 of electronics subsystem 713 are shorter in height than the air-cooled heat sinks 734' coupled to memory support modules 732 near back 733 of electronics subsystem 713. This size difference is to accommodate the coolant-carrying tubes 740, 742 since, in this embodiment, the header subassembly 750 is at the front 731 of the electronics drawer and the multiple liquid-cooled cold plates 720 are in the middle of the drawer.

Liquid-based cooling system 715 comprises a pre-configured monolithic structure which includes multiple (pre-assembled) liquid-cooled cold plates 720 configured and disposed in spaced relation to engage respective heat-generating electronic devices. Each liquid-cooled cold plate 720 includes, in this embodiment, a liquid coolant inlet and a liquid coolant outlet, as well as an attachment subassembly (i.e., a cold plate/load arm assembly). Each attachment subassembly is employed to couple its respective liquid-cooled cold plate 720 to the associated electronic device to form the cold plate and electronic device assemblies. Alignment openings (i.e., thru-holes) are provided on the sides of the cold plate to receive alignment pins or positioning dowels during the assembly process. Additionally, connectors (or guide pins) are included within attachment subassembly which facilitate use of the attachment assembly.

As shown in FIG. 7, header subassembly 750 includes two liquid manifolds, i.e., a coolant supply header 752 and a coolant return header 754, which in one embodiment, are coupled together via supporting brackets. In the monolithic cooling structure of FIG. 7, the coolant supply header 752 is metallurgically bonded in fluid communication to each coolant supply tube 740, while the coolant return header 754 is metallurgically bonded in fluid communication to each coolant return tube 742. A single coolant inlet 751 and a single coolant outlet 753 extend from the header subassembly for coupling to the electronics rack's coolant supply and return manifolds (not shown).

FIG. 7 also depicts one embodiment of the pre-configured, coolant-carrying tubes. In addition to coolant supply tubes 740 and coolant return tubes 742, bridge tubes or lines 741 are provided for coupling, for example, a liquid coolant outlet of one liquid-cooled cold plate to the liquid coolant inlet of another liquid-cooled cold plate to connect in series fluid flow the cold plates, with the pair of cold plates receiving and returning liquid coolant via a respective set of coolant supply and return tubes. In one embodiment, the coolant supply tubes 740, bridge tubes 741 and coolant return tubes 742 are each pre-configured, semi-rigid tubes formed of a thermally conductive material, such as copper or aluminum, and the tubes are respectively brazed, soldered or welded in a fluid-tight manner to the header subassembly and/or the liquid-cooled cold plates. The tubes are pre-configured for a particular electronics system to facilitate installation of the monolithic structure in engaging relation with the electronic system.

Figure 8:
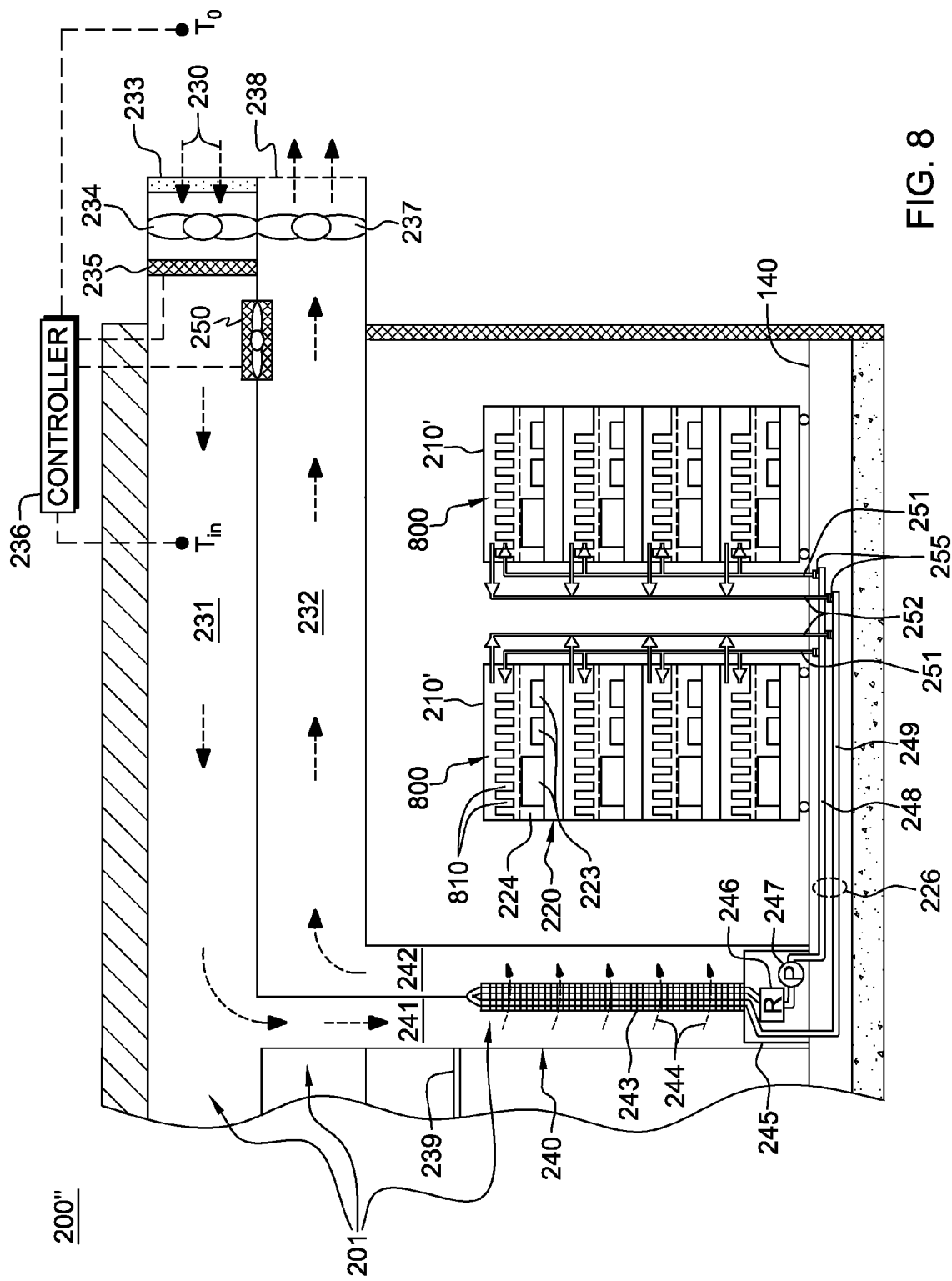
FIG. 8 is a schematic of another embodiment of a data center comprising a cooling apparatus, including an air-side economizer and liquid-based cooling of one or more electronics racks of the data center, in accordance with one or more aspects of the present invention.

FIG. 8 depicts another embodiment of a data center 200", in accordance with one or more aspects of the present invention. As illustrated, data center 200" is substantially identical to data center 200 described above in connection with FIG. 2. However, in this embodiment, the cooling subsystem comprises a liquid-cooled condenser 800, with multiple liquid-cooled condensers being shown in association with multiple electronic subsystems 220 of multiple electronics racks 210' within the data center. Note that this embodiment is provided by way of further example only. As indicated above, the data center may implement either homogeneously or heterogeneously, multiple different types of cooling subsystems, such as liquid-cooled electronic subsystems, including (for example) liquid-cooled condensers 800, such as depicted in FIG. 8.

In the depicted example, the multiple cooling subsystems (comprising liquid-cooled condensers 800) and the associated multiple electronic subsystems 220 together form multiple liquid-cooled electronic subsystems. Each liquid-cooled electronic subsystem includes (in this example) a housing which encloses a respective electronic subsystem 220, including a plurality of electronic components 223 thereof. In this embodiment, the electronic components are (by way of example) immersion-cooled in a coolant 224, such as a dielectric coolant. The cooling system is designed for the dielectric coolant to boil in typical operation, generating dielectric coolant vapor which rises within the chamber defined by the housing, and within which the liquid-cooled condenser 800 resides. In the embodiment depicted, liquid-cooled condenser 800 includes a plurality of condenser fins 810 extending into the chamber to facilitate condensing of vapor rising to the liquid-cooled condenser. One or more coolant-carrying channels extend through the liquid-cooled condenser 800 and are in fluid communication with the respective rack-level supply and return manifolds 251, 252, described above. After extracting heat from the vapor, and condensing the vapor, the warmer coolant leaves the liquid-cooled condenser and returns via the rack-level coolant return plenum and the coolant return manifold to the central cooling station.

Note that in the embodiments described herein, in operation, coolant is circulated between the respective cooling subsystems within the electronics racks and the liquid-to-air heat exchanger of the one or more central, air-cooled cooling stations. Heat is transferred via the circulating coolant from one or more heat-generating electronic components within the electronic subsystems, and rejected in the liquid-to-air heat exchanger of the air-cooled cooling station(s) to the cooling airflow passing across the liquid-to-air heat exchanger. The heated airflow is then exhausted via, for example, a common airflow exhaust plenum. Note also that, the central, air-cooled cooling station is configured (in one embodiment) to accommodate heat removal from two or more electronics racks, or an entire data center, if desired.

Figure 9:
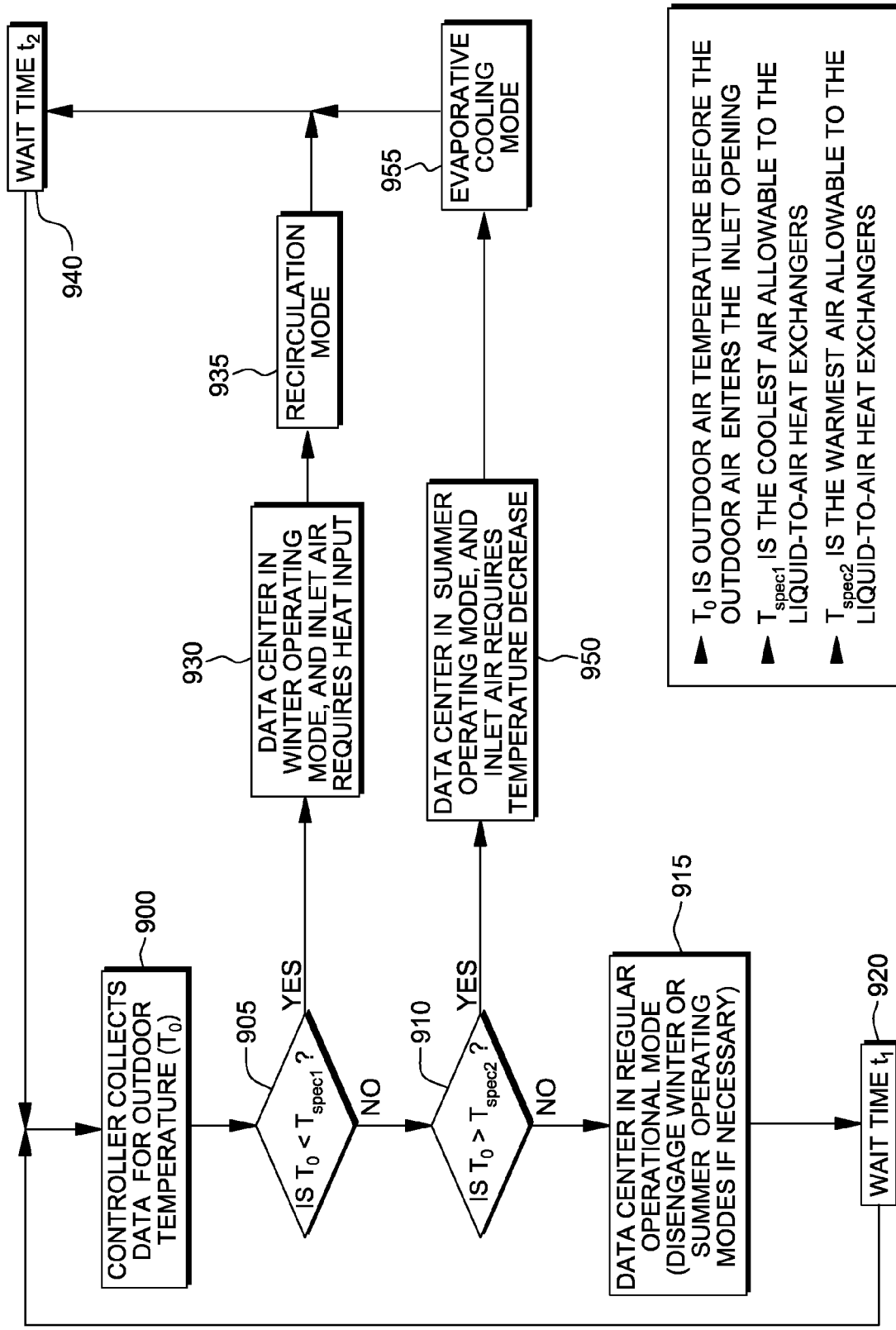
FIG. 9 depicts one embodiment of processing for controlling operation of a cooling apparatus, such as depicted in FIGS. 2-8, in accordance with one or more aspects of the present invention.
Figure 10B:
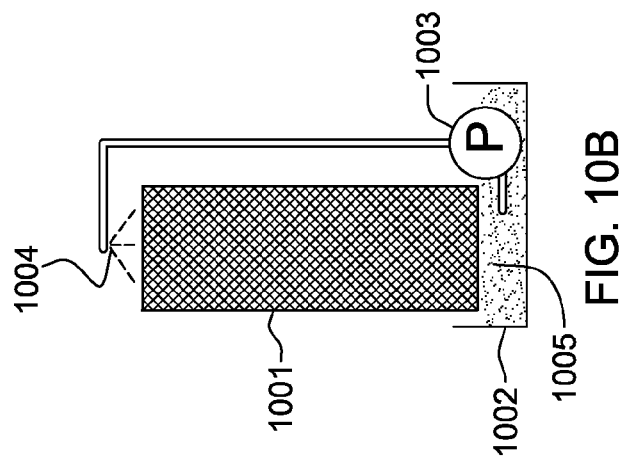
FIG. 10B is a schematic of one embodiment of a controllable evaporative cooling system to be employed in a cooling apparatus, such as depicted in FIGS. 2-8, in accordance with one or more aspects of the present invention.
Figure 10A:
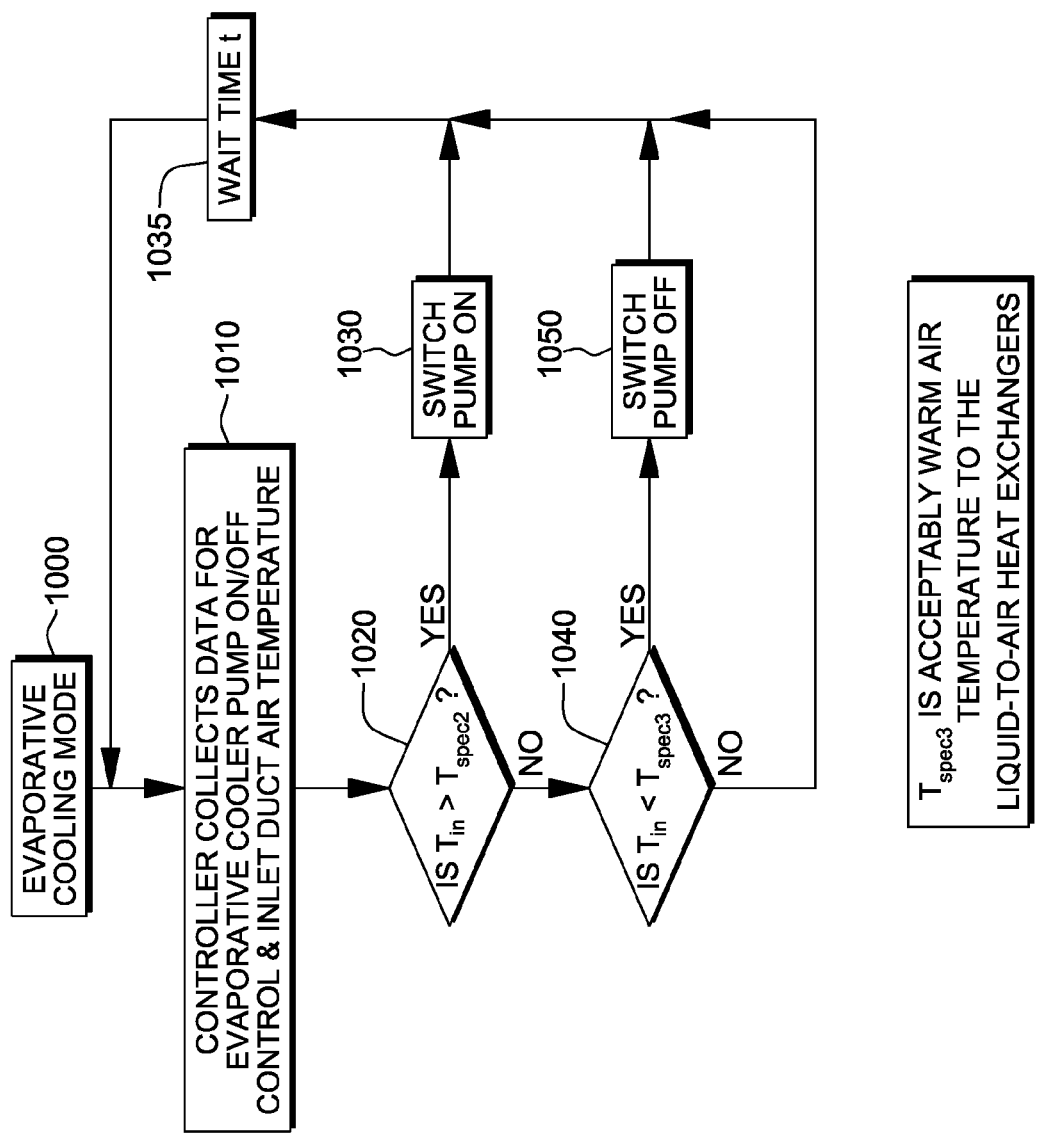
FIG. 10A depicts one embodiment of processing for controlling operation of the evaporative cooling system of a cooling apparatus, such as depicted in FIGS. 2-8, in accordance with one or more aspects of the present invention.
Figure 11:
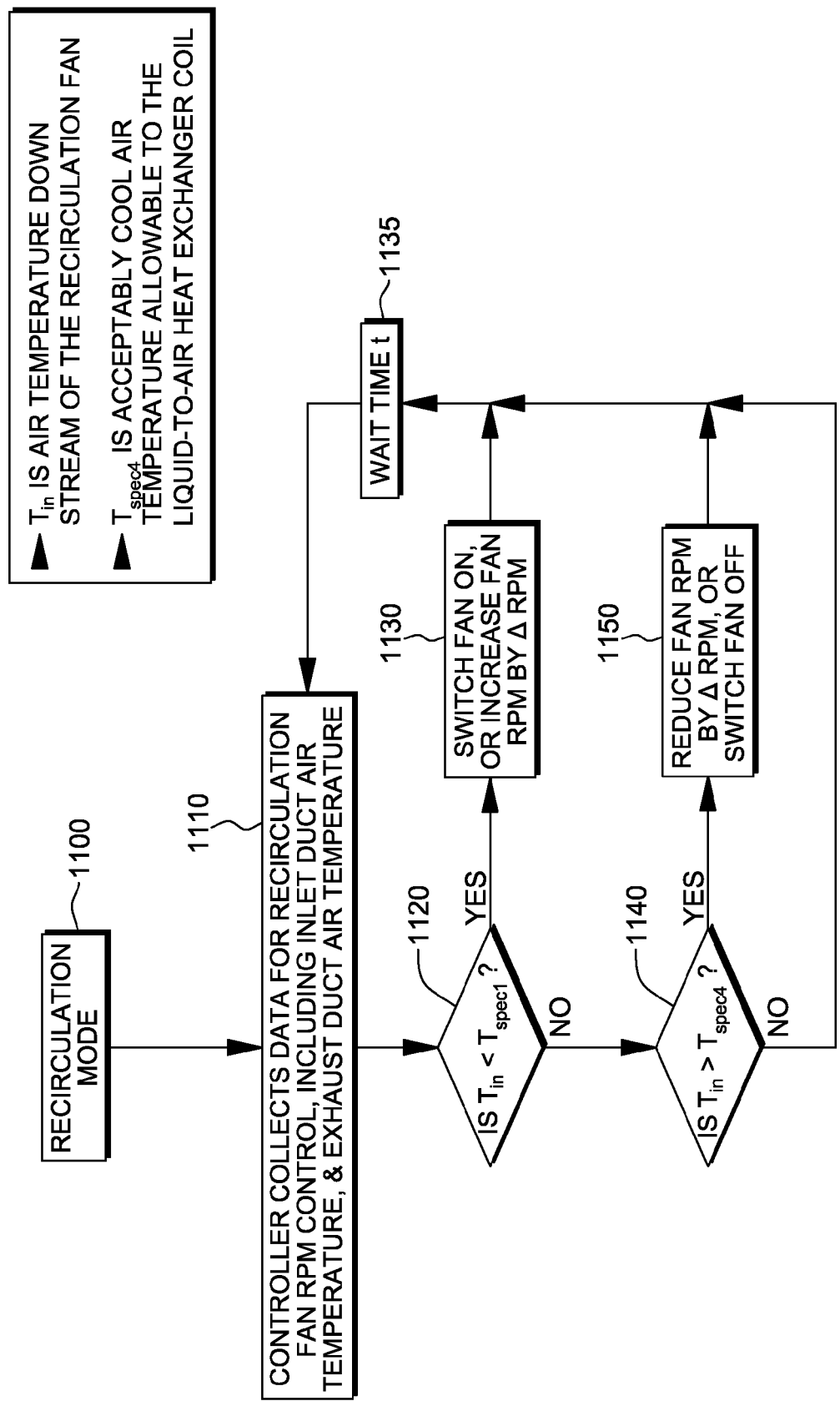
FIG. 11 depicts one embodiment of a process for controlling a controllable recirculation fan coupling the airflow exhaust plenum to the cooling airflow supply plenum of a cooling apparatus, such as depicted in FIGS. 2-8, in accordance with one or more aspects of the present invention.

FIGS. 9-11 depicts various control processes of a cooling apparatus such as a described above in connection with FIGS. 2-8. In one embodiment, the control processes may be implemented by a controller associated with the cooling apparatus, such as controller 236 of the cooling apparatuses of FIG. 2, 3 or 8.

Referring to the process of FIG. 9, the controller collects data on the outdoor temperature at the air intake to the cooling apparatus 900, and determines whether the outdoor temperature ($T_o$) is less than a first temperature threshold ($T_{spec1}$) 905.

In one embodiment, the first temperature threshold ($T_{spec1}$) is the coldest air temperature allowable to the liquid-to-air heat exchangers of the local cooling stations without entering a winter mode. Assuming that the outdoor temperature ($T_o$) is greater than or equal to the first specified temperature ($T_{spec1}$), then processing determines whether the outdoor temperature ($T_o$) is greater than a second specified temperature ($T_{spec2}$) 910, which is a threshold of the warmest air temperature allowable to the liquid-to-air heat exchangers without entering a summer mode. Assuming that the outdoor temperature ($T_o$) is less than or equal to the second specified temperature ($T_{spec2}$) 915, then the data center is in regular operating mode, and the winter or summer operating modes may be disengaged if previously engaged. Processing then waits a first time interval ($t_1$) 920 before again collecting data on the outdoor air temperature at the intake of the cooling apparatus 900, and repeats the process.

Assuming that the outdoor temperature ($T_o$) is less than the first specified temperature threshold ($T_{spec1}$), meaning that the outdoor temperature has dropped below the coolest allowable air temperature threshold to the liquid-to-air heat exchangers, then the controller places the cooling apparatus in winter mode, meaning that the air inlet temperature requires heating 930. Responsive to this, processing initiates recirculation mode 935 to redirect a portion of the warm airflow exhausting via the airflow exhaust plenum into the cooling airflow supply plenum. Processing then waits a second time interval ($t_2$) 940, before again collecting outdoor temperature readings 900, and repeating the process. Note that in one embodiment, time interval $t_1$ and time interval $t_2$ may be the same time intervals, or may be different intervals.

Assuming that the outdoor temperature ($T_o$) is greater than the second temperature threshold ($T_{spec2}$), then processing places the cooling apparatus in summer operating mode, and initiates a dry bulb temperature decrease of the outdoor air being drawn into the cooling airflow supply plenum across the evaporative cooling system 950. Processing enters the evaporative cooling mode 955 to initiate evaporative cooling of the outdoor air drawn across the evaporative cooling media of the evaporative cooling system, and then waits second time interval ($t_2$) 940 before again collecting outdoor temperature data, and repeating the process.

FIGS. 10A & 10B depict one embodiment of an evaporative cooling process and evaporative cooling system, respectively, in accordance with an aspect of the present invention. Referring to the process of FIG. 10A, evaporative cooling mode 1000 is entered with the controller collecting data for controlling evaporative cooler pump ON/OFF, including inlet duct air temperature ($T_{in}$) 1010. Processing determines whether the inlet duct air temperature ($T_{in}$) is greater than the second specified temperature ($T_{spec2}$) 1020, and if "yes", switches the evaporative cooling pump ON 1030. As illustrated in the embodiment of FIG. 10B, the evaporative cooling system may comprise a porous media 1001 through which the inlet air passes, a container 1002, a pump 1003, and one or more spray nozzles 1004. Water 1005 is pumped via pump 1003 to water spray nozzles 1004 where it drips down porous media 1001 and cools by evaporation the air passing through the porous media.

Continuing with the processing of FIG. 10A, if the inlet duct air temperature ($T_{in}$) is less than a third specified temperature threshold ($T_{spec3}$) 1040 processing switches the pump OFF 1050. Otherwise, processing waits a time interval (t) 1035 before again collecting the relevant data 1010, and repeating the process. Note that in this example, the third specified temperature threshold ($T_{spec3}$) is a defined, acceptable air temperature for the liquid-to-air heat exchangers of the local cooling stations.

FIG. 11 illustrates one embodiment of processing for control of the airflow recirculation mode. As noted, airflow recirculation mode is entered 1100 when the outdoor temperature ($T_o$) is below a first specified temperature threshold. Processing initially collects data for control of the recirculation fan's RPMs, including the inlet duct air temperature and the exhaust duct air temperature 1110. Processing determines whether the inlet duct air temperature ($T_{in}$) is less than the first temperature threshold ($T_{spec1}$) 1120, and if "yes", increases the recirculation fan's speed (RPMs) by a set ΔRPM 1130. If the inlet duct air temperature ($T_{in}$) is greater than or equal to the first temperature threshold ($T_{spec1}$), then processing determines whether the inlet duct air temperature ($T_{in}$) is greater than a fourth specified temperature threshold ($T_{spec4}$) 1140. In this processing example, the inlet duct air temperature ($T_{in}$) is the air temperature downstream of the recirculation fan, and the fourth temperature threshold ($T_{spec4}$) is a defined, acceptably cool air temperature that is allowable to the liquid-to-air heat exchanger coil of the local cooling stations. If the inlet duct air temperature ($T_{in}$) is greater than the fourth temperature threshold ($T_{spec4}$), then the recirculation fan's speed may be reduced by the set amount (ΔRPM) 1150. Thereafter, processing waits time interval (t) 1135 before again collecting temperature data for control of the recirculation fan speed, as described above.

As will be appreciated by one skilled in the art, control aspects of the present invention may be embodied as a system, method or computer program product. Accordingly, control aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, control aspects of the present invention may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible, non-transitory medium that can contain or store a program for use by or in connection with an instruction execution system, apparatus, or device.

In one example, a computer program product includes, for instance, one or more computer readable storage media to store computer readable program code means or logic thereon to provide and facilitate one or more aspects of the present invention.

Program code embodied on a computer readable medium may be transmitted using an appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language, such as Java, Smalltalk, C++ or the like, and conventional procedural programming languages, such as the "C" programming language, assembler or similar programming languages.

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention.

What is claimed is:

1. A method comprising:
providing a cooling apparatus, the providing comprising:
providing at least one outdoor air-cooled cooling station separate from at least one electronics rack to be cooled and disposed within a data center comprising the at least one electronics rack, each outdoor-air-cooled cooling station comprising:
a liquid-to-air heat exchanger, and
ducting configured to direct cooling airflow across the liquid-to-air heat exchanger to facilitate transfer of heat within the data center from the liquid-to-air heat exchanger to the cooling airflow; and
providing a cooling airflow supply plenum and an airflow exhaust plenum, the ducting of the at least one outdoor-air-cooled cooling station being coupled to the cooling airflow supply plenum and to the airflow exhaust plenum, and the ducting receiving cooling airflow from the cooling airflow supply plenum, directing the cooling airflow across the liquid-to-air heat exchanger, and exhausting heated airflow from the liquid-to-air heat exchanger to the airflow exhaust plenum, wherein the cooling airflow comprises outdoor air drawn into the cooling apparatus;
providing at least one cooling subsystem for association with the at least one electronics rack, one cooling subsystem of the at least one cooling subsystem comprising at least one of a liquid-cooled condenser facilitating immersion-cooling of one or more electronic components of the at least one electronics rack, a liquid-cooled structure providing conductive cooling of one or more electronic components of the at least one electronics rack, or an air-to-liquid heat exchanger associated with the at least one electronics rack and cooling airflow passing through the at least one electronics rack;
providing at least one coolant loop, one coolant loop of the at least one coolant loop coupling the one cooling subsystem, of the at least one electronics rack to the liquid-to-air heat exchanger of the separate, at least one outdoor-air-cooled cooling station, wherein the one coolant loop facilitates circulation of liquid coolant between the one cooling subsystem of the at least one electronics rack and the liquid-to-air heat exchanger of the separate, at least one outdoor-air-cooled cooling station, and wherein heat is transferred via the circulating liquid coolant from the at least one electronics rack and rejected in the liquid-to-air heat exchanger of the at least one outdoor-air-cooled cooling station to the cooling airflow passing across the liquid-to-air heat exchanger; and
providing a controllable air recirculation fan disposed between the airflow exhaust plenum and the cooling airflow supply plenum for selectively, actively recirculating a portion of exhausting airflow in the airflow exhaust plenum to the cooling airflow supply plenum, and a controller coupled to the controllable air recirculation fan, the controller activating recirculation of at least a portion of the exhausting heated airflow in the airflow exhaust plenum to the cooling airflow supply plenum responsive to a temperature of the outdoor air being below a set low temperature threshold.

2. The method of claim 1, wherein the cooling apparatus further comprises an evaporative cooling system associated with the cooling airflow supply plenum, and wherein the method further comprises selectively cooling outdoor air being drawn into the cooling airflow supply plenum employing the evaporative cooling system responsive to a temperature of the outdoor air exceeding a set high temperature threshold.

3. The method of claim 1, wherein the at least one electronics rack comprises one electronics rack with multiple electronic subsystems, and the cooling apparatus comprises multiple cooling subsystems, each electronic subsystem of the multiple electronic subsystems having a respective cooling subsystem of the multiple cooling subsystems associated therewith, and wherein the one cooling subsystem of the multiple cooling subsystems comprises at least one of the liquid-cooled condenser facilitating immersion-cooling of one or more electronics components of the at least one electronics rack, or the liquid-cooled structure providing conductive cooling of the one or more electronics components of the one electronics rack.

4. The method of claim 3, wherein another cooling subsystem of the multiple cooling subsystems comprises the air-to-liquid heat exchanger associated with the at least one electronics rack and cooling airflow passing through the at least one electronics rack.

5. The method of claim 1, wherein the cooling apparatus facilitates cooling of multiple electronics racks, and wherein the cooling apparatus comprises multiple cooling subsystems, the multiple cooling subsystems comprising:
a first cooling subsystem of the multiple cooling subsystems associated with a first electronics rack of the multiple electronics racks, the first cooling subsystem comprising at least one of a first liquid-cooled condenser facilitating immersion-cooling of one or more electronic components of the first electronics rack, a first liquid-cooled structure providing conductive cooling to one or more electronic components of the first electronics rack, or a first air-to-liquid heat exchanger associated with the first electronics rack and cooling airflow passing through the first electronics rack; and
a second cooling subsystem comprising at least one of a second liquid-cooled condenser facilitating immersion-cooling of one or more electronic components of a second electronics rack of the multiple electronics, a second liquid-cooled structure providing conductive cooling to one or more electronic components of the second electronics racks, or a second air-to-liquid heat exchanger associated with the second electronics rack and cooling airflow passing through the second electronics rack.

6. The method of claim 1, wherein one air-cooled cooling station of the at least one air-cooled cooling station is a central, air-cooled cooling station providing cooling to multiple electronics rack, and facilitating heat transfer from the multiple electronics racks, via the circulating coolant, to the cooling airflow passing across the liquid-to-air heat exchanger thereof.

* * * * *